United States Patent [19]

Sasson

[11] Patent Number: 5,195,182

[45] Date of Patent: Mar. 16, 1993

[54] FRAME BUFFER ARCHITECTURE FOR STORING SEQUENTIAL DATA IN ALTERNATING MEMORY BANKS

[75] Inventor: Steven J. Sasson, Hilton, N.Y.

[73] Assignee: Eastman Kodak Company, Rochester, N.Y.

[21] Appl. No.: 331,918

[22] Filed: Apr. 3, 1989

[51] Int. Cl.⁵ .................. H04N 5/225; G06F 3/00
[52] U.S. Cl. .................. 395/250; 358/909; 358/213.22; 364/DIG. 2; 364/926.1; 364/926.3; 364/926.6; 364/966.1; 364/966.3
[58] Field of Search ... 364/200 MS File, 900 MS File; 358/909, 213.22; 395/250

[56] References Cited

U.S. PATENT DOCUMENTS

| | | | |
|---|---|---|---|
| 4,007,486 | 2/1977 | Inaba et al. | 358/13 |
| 4,183,058 | 1/1980 | Taylor | 358/127 |
| 4,298,931 | 11/1981 | Tachiuchi et al. | 364/200 |
| 4,424,561 | 1/1984 | Stanley et al. | 364/200 |
| 4,432,009 | 2/1984 | Reitmeier et al. | 358/22 |
| 4,435,765 | 3/1984 | Uchida et al. | 364/200 |
| 4,449,199 | 5/1984 | Daigle | 364/900 |
| 4,567,506 | 1/1986 | Shinoda et al. | 358/11 |
| 4,580,214 | 4/1986 | Kubo et al. | 364/200 |
| 4,622,634 | 11/1986 | Fidel | 364/200 |
| 4,725,987 | 2/1988 | Cates | 365/220 |
| 4,797,806 | 1/1989 | Krich | 364/900 |
| 4,800,530 | 1/1989 | Itoh et al. | 365/189 |
| 4,851,914 | 7/1989 | Pfanhouser et al. | 358/213.19 |
| 4,958,236 | 9/1990 | Nagashima | 358/445 |

OTHER PUBLICATIONS

Toshiba Integrated Circuit Technical Data for TC514100J/Z-80, TC514100J/Z-10, Oct. 24, 1987.

Primary Examiner—Kevin A. Kriess
Attorney, Agent, or Firm—Parkhurst, Wendel & Rossi

[57] ABSTRACT

A digital frame buffer architecture is disclosed including a least two data banks, each data bank having at least a number of DRAMs equal to the number of bits in the data word to be stored. The DRAMs have a write cycle time greater than the input pixel data rate, but less than the input pixel data rate multiplied by the number of data banks provided. Succeeding input data words are alternately stored in the data banks. Sufficient time is provided to complete a write cycle as each data bank only stores every other data word.

7 Claims, 4 Drawing Sheets

FRAME BUFFER ARCHITECTURE FOR STORING SEQUENTIAL DATA IN ALTERNATING MEMORY BANKS

BACKGROUND OF THE INVENTION

The present invention relates to digital storage systems and specifically to digital frame buffers or frame stores used to store digitized images.

Recent advances in electronic still imaging have led to the development of compact solid-state electronic imaging devices having pixel resolutions on the order of megabytes. The "megapixel" imaging devices are of particular interest in the development of hand-held electronic still cameras which would be capable of approaching the image resolution of conventional photographic film technology. While improvements in resolution of electronic imaging devices are welcome, the increase in resolution also presents problems when attempting to employ megapixel imaging devices in compact hand-held electronic still cameras, namely, the need to provide sufficient memory capacity—on the order of several megabytes—to store a plurality of images at data rates on the order of about 13-15 MHz or about 70-75 ns/pixel.

Digital frame buffers capable of handling the required memory capacity and data rates have been developed for use in digital image processors. For example, U.S. Pat. No. 4,725,987 issued to Cates discloses a fast frame store architecture that employs dynamic random access memory (DRAM) devices in a plurality of memory banks. Each memory bank includes a plurality of memory sections having a number of 64K DRAMs equal to the number of bits in the data words to be stored. The 64K DRAMs employed in the frame store disclosed in U.S. Pat. No. 4,725,987 have a basic memory cycle time of about 300 ns which is much slower than the required 70-75 ns/pixel data rate. Thus, double buffering of the input data must be employed to slow the data rate to the memory banks.

The above-described frame store architecture, while being sufficient for use in an image processing system, is not an optimum architecture for an electronic still camera due to the necessity of double buffering the input data. Double buffering requires a large number of system components which is an undesirable feature when attempting to design a compact hand-held camera. Double buffering could be eliminated if the DRAM's employed in the frame buffer were capable of latching and storing data at the higher 70-75 ns/pixel data rate.

Improvements in DRAM technology have led to devices capable of storing four megabytes of information, but the write cycle time of such devices is still on the order of 150 ns. Thus, some type of buffering must still be employed to match the data input rate to the write cycle time of the DRAMs.

Accordingly, it would be desirable to provide an architecture for a compact digital frame store capable of operating at the data rates associated with megapixel imaging devices without requiring the use of double buffering.

SUMMARY OF THE INVENTION

The present invention departs from the prior art use of double buffering to match the input data rate to a digital frame buffer memory or write cycle time, by providing a digital frame buffer in which alternating pixel data of a video line of a digitized image are "ping-ponged" between selected memory banks.

More specifically, the present invention provides a digital frame buffer including a least two data banks, each data bank having at least a number of DRAMs equal to the number of bits in the data word to be stored. The DRAMs have a write cycle time greater than the input pixel data rate, but less than the input pixel data rate multiplied by the number of data banks provided. Successive input data words are alternately stored in the data banks. Sufficient time is provided to complete a write cycle as each data bank only stores every other data word.

BRIEF DESCRIPTION OF THE DRAWINGS

With the above as background, reference should now be made to the following detailed description of the preferred embodiment in conjunction with the drawings in which:

FIG. 3A is a memory map for the odd bank of the frame store illustrated in FIG. 2;

FIG. 3B is a memory map for the even bank of the frame store illustrated in FIG. 2;

DETAILED DESCRIPTION OF THE PREFERRED EMBODIMENT

The present invention will be described with reference to an electronic still camera system, but it will be readily apparent to one of ordinary skill in the art that the present invention is applicable to other data storage systems and is not limited to the specific embodiment described below.

Figure 1:
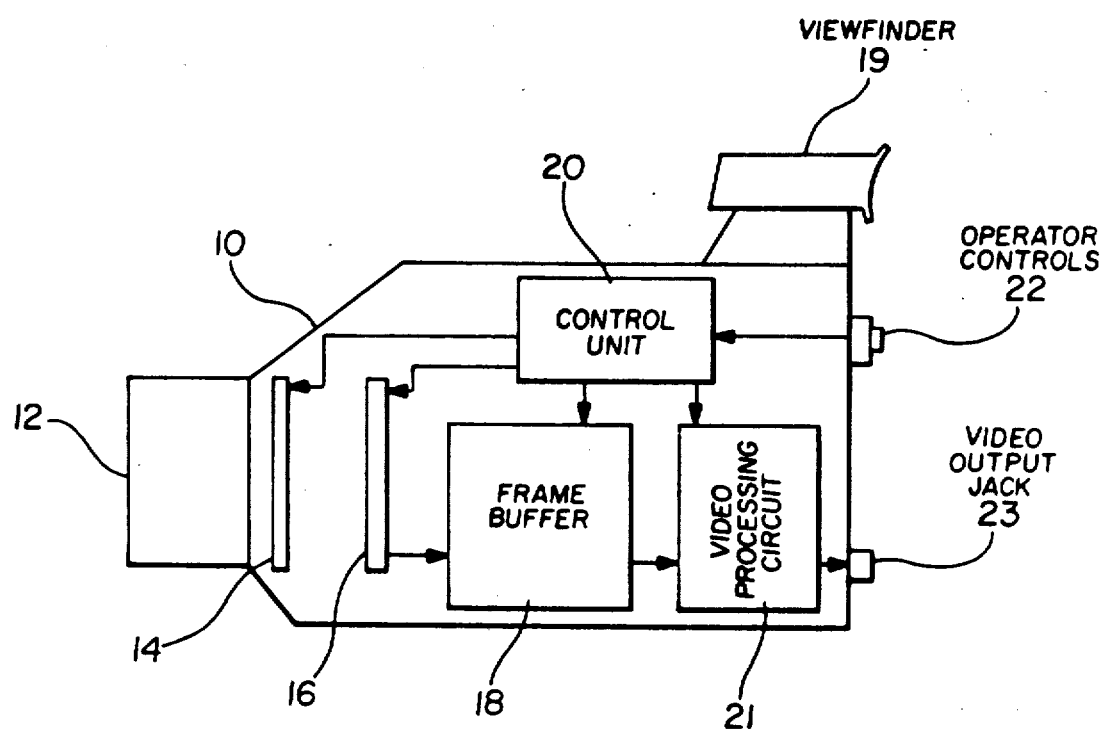
FIG. 1 illustrates an electronic still camera incorporating the present invention.

Referring now to FIG. 1, an electronic still camera 10 is shown having a lens system 12, a shutter mechanism 14, an electronic imaging device 16, a frame buffer 18, and a control unit 20. The control unit 20 is coupled to operator controls 22, for example a shutter button, and controls the operation of the shutter mechanism 14, electronic imaging device 16 and frame buffer 18 in accordance with input signals received from the operator controls 22. The frame buffer 18 is coupled to a video processing circuit 21 that receives image information stored in the frame buffer 18 and generates a standardized video output signal that is supplied to a video output jack 23. The camera 10 also includes an attached viewfinder 19.

Other camera configurations employing the instant invention are of course possible. For example, the viewfinder 19 may include a CRT coupled to the output of the video processing circuit 21 in order to show the user the actual scene being imaged by the electronic imaging device 16. The camera 10 illustrated in FIG. 1 is only one possible configuration that may employ the frame buffer architecture of the present invention.

Figure 2:
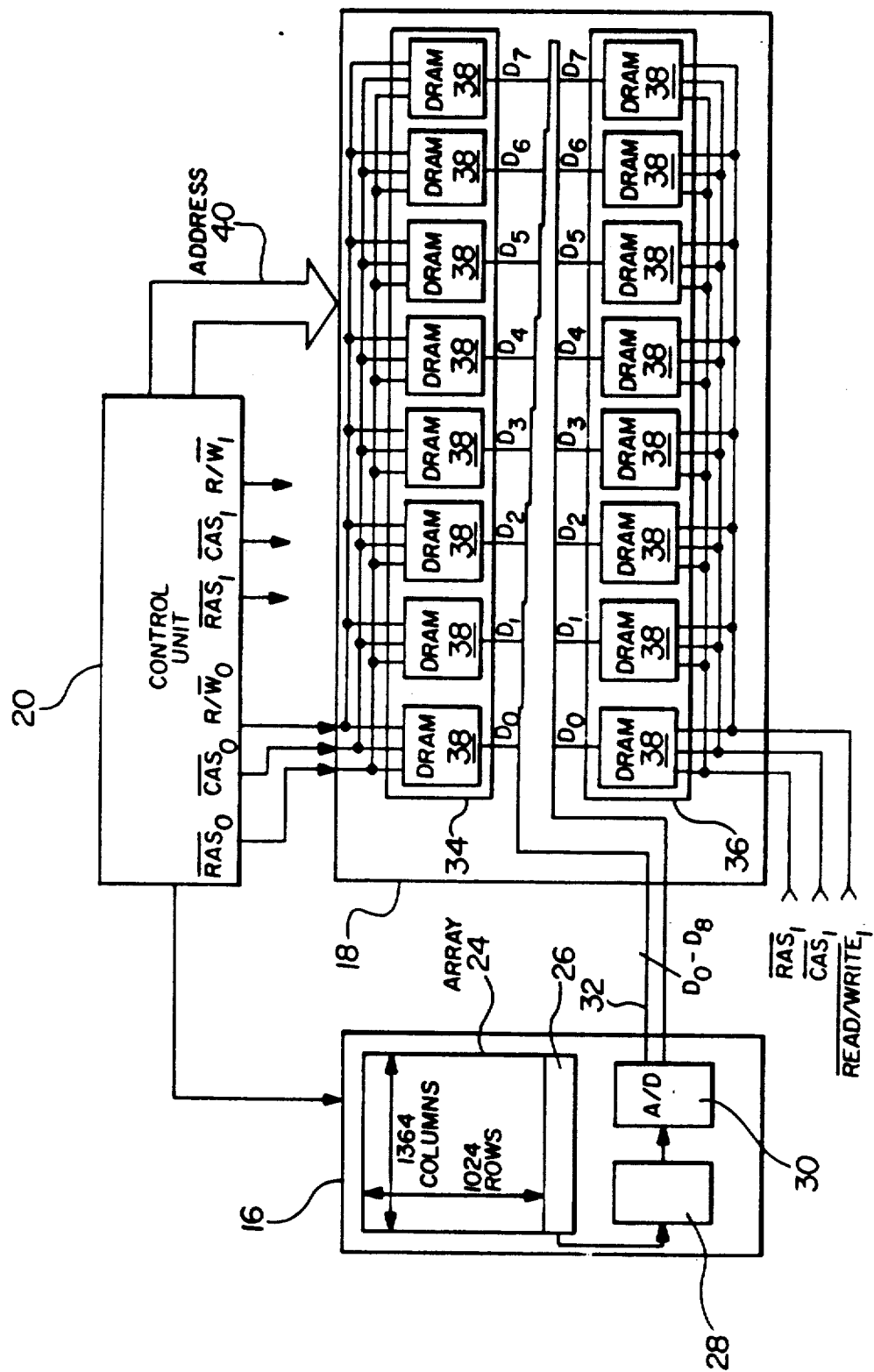
FIG. 2 is a detailed block diagram of the electronic circuitry employed in the electronic still camera illustrated in FIG. 1.

The electronic imaging device 16 is preferably a full frame CCD image sensor, although other types of image sensors may be readily employed, having a plurality of image pixel elements arranged in a two-dimensional array 24 of 1364 horizontal columns by 1024 vertical rows as illustrated in FIG. 2. The array 24 is coupled to an output shift register 26 that receives the photocharge stored in the pixels (hereinafter referred to as pixel image data) of each row in parallel and transfers the received pixel image data in serial to a detector/amplifier circuit 28. The output of the detector/amplifier circuit 28 is coupled to an analog-to-digital (A/D) converter 30 that converts the analog pixel image data to a digital output word having 8-bits, although A/D converters having a greater resolution may of course be employed. The operational details of clocking the image pixel data out of the array 24 are well known in the video processing art and therefore will not be discussed in greater detail.

The digital output word from the A/D converter 30 is supplied via a input data buss 32 to the frame buffer 18 as illustrated in FIG. 2. The frame buffer 18 includes first and second data banks 34 and 36 coupled to the input data buss 32. Each data bank has at least one DRAM 38 for each bit of the data word to be stored. In the preferred embodiment illustrated, each data bank 34 and 36 includes eight DRAMs 38, each DRAM 38 having a memory capacity of four megabytes. Each data bank 34 and 36 is also coupled to the control unit 20 via and address buss 40 and various control lines such as a row address strobe (RAS), a read/write input line (WRITE) and a column address strobe line (CAS).

As mentioned above, the DRAMs 38 have a memory capacity of four megabytes. Preferably, the addressing configuration of the DRAMs 38 is arranged in a 2048 row by 2048 column array. The DRAMs 38 must also have a write cycle time greater than the input pixel data rate, but less than the input pixel data rate multiplied by the number of data banks to be employed. For example, a STC514100J/Z-80 DRAM manufactured by the Toshiba Corporation has a write cycle time of 150 ns and can be employed as the DRAMs 38.

The STC514100J/Z-80 DRAM write cycle time of 150 ns requires that the maximum pixel data rate be about 75 ns/pixel or approximately 13.3 MHz. Thus, the operating frequency of the electronic imaging device 16 should be limited to a line readout time of approximately 102.3 μs (1364 pixels/line × 75 ns/pixel) and a total readout time of approximately 104.8 ms (1024 lines × 102.3 μs/line) when the STC514100J/Z-80 DRAM is employed. The operating frequency of 13.3 MHz is slightly slower than the operating frequency generally employed in many electronic imager applications, but would be acceptable in a still camera application as dark current build up during the slightly longer readout time would be minimal. Of course, the operating frequency of the electronic imager may increase as the write cycle time of the DRAMs employed decreases.

The operation of the electronic still camera 10 and frame buffer 18 will now be discussed with reference to FIGS. 1 and 2. Upon receipt of an initiation signal from the operator controls 22, the control unit 20 opens the shutter mechanism 14 to expose the electronic imaging device 16 to incident light for a predetermined period of time. After completion of the exposure operation, the contents of each row of image pixel elements of the electronic imaging device 16 is shifted in parallel into the output shift register 26 and then serially out of the output shift register 26 to the detection/amplifier circuit 28. The analog output signal indicative of the pixel data of the detection/amplifier circuit 28 is provided to the analog-to-digital (A/D) converter 30, which converts the analog signal into an 8-bit digital word.

The 8-bit digital word representing the image pixel data for one pixel is supplied to the frame store 18 via the input data buss 32. The control unit 20 supplies the proper address data via the address buss 40 to the frame store 18, such that one-bit of the 8-bit digital word is supplied to each of the DRAMs 38 of the first data bank 34. As the DRAMs 38 require a 150 ns to complete a write cycle, the next data word received from the A/D converter 30 cannot be stored in the first data bank 34. Instead, the control unit 20 addresses the second data bank 36 so that the next data word received from the A/D converter 30 is supplied and stored in the second data bank 36. The next data word is then stored in the first data bank 34 and the process in repeated.

Figure 4A:
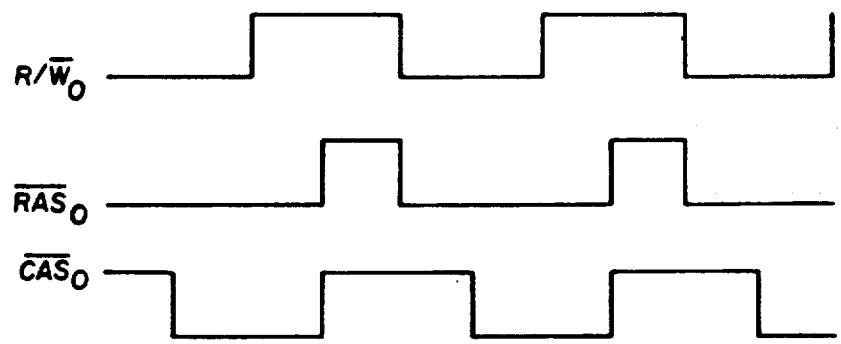
FIG. 4A illustrates a timing diagram for the addressing of the odd memory bank illustrated in FIG. 2.
Figure 4B:
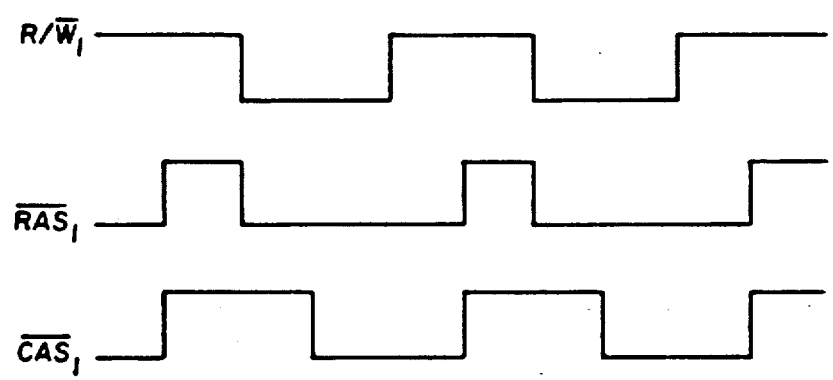
FIG.4B illustrates a timing diagram for the addressing of the even memory bank illustrated in FIG. 2.

The odd and even pixel image data from a given row of image pixel elements of array 24 are therefore "ping-ponged" back and forth between the first and second data banks 34 and 36, i.e., data bank 34 stores "odd" pixel image data and data bank 36 stores "even" pixel image data. Sufficient time to perform a write cycle operation is provided as each data bank 34 and 36 must store only every other data word. A timing diagram of the memory bank addressing is illustrated in FIG. 4.

An eleven bit address 25 is used to address the 2048 rows and 2048 columns of each of the DRAMs 38. As the addressing configuration for the DRAMs is basically a square array, three lines of even or odd pixel line image data can be stored in each row or column of the DRAMs 38, and a total of six images can be stored in the two banks 34 and 36 of the frame buffer 18.

Figures 3A, 3B:
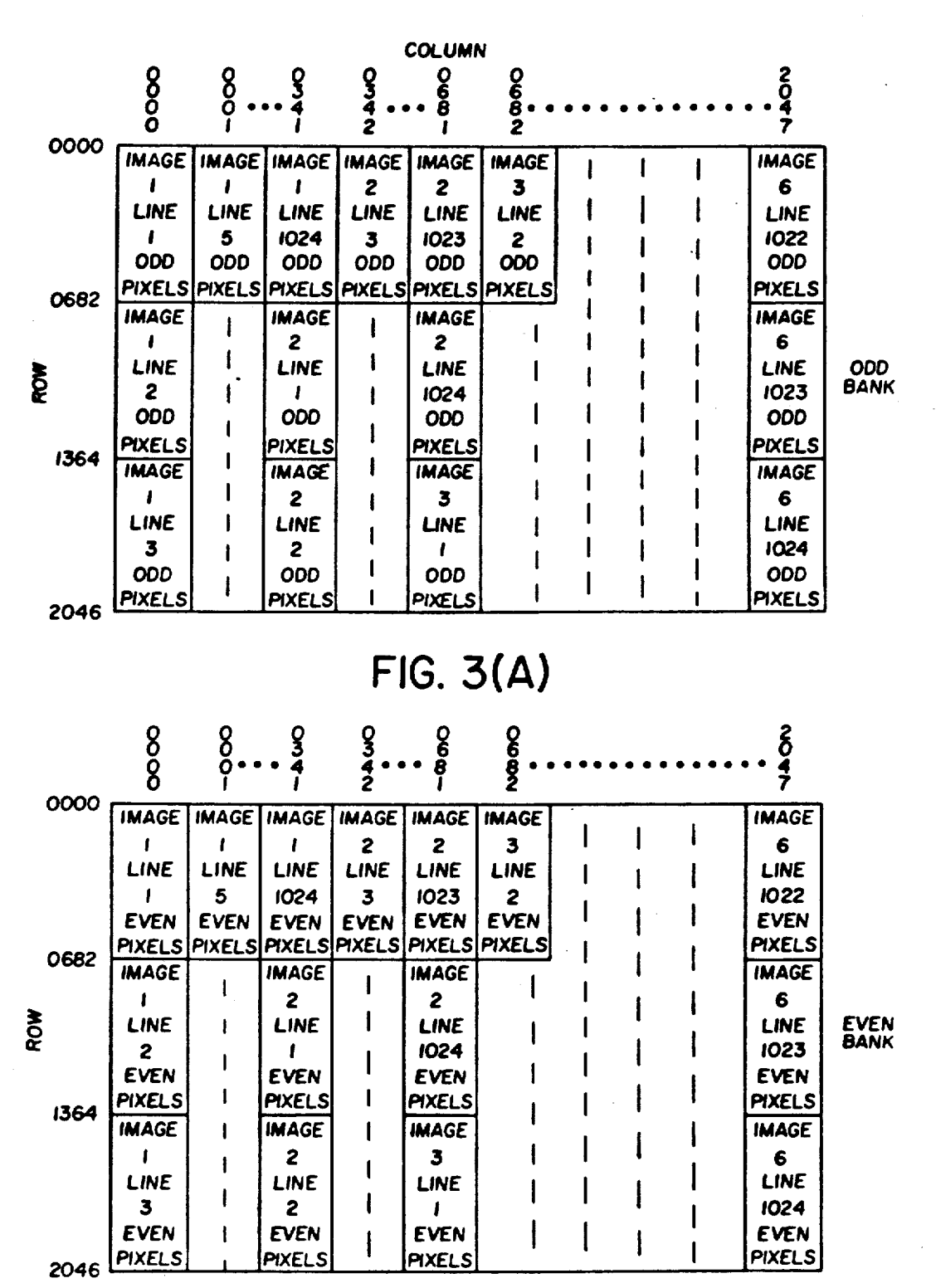

A preferred addressing configuration is illustrated by the memory maps shown in FIGS. 3A and 3B, which indicate that the pixel line data is sequentially stored in each column of the memory array instead of across the rows. Each stored image requires 341⅓ columns of storage space. Thus, image 1 is stored from column address 0000, row address 0000 to column address 0341, row address 0681; image 2 is stored from column address 0341, row address 0682 to column address 0681, row address 1363 and so forth, with each stored image line filling 682 rows. Storing the pixel line data sequentially in each column insures that each row of the array will be addressed within the required refresh period for the DRAM. In the case of the STC514100J/Z-80 DRAM, the refresh period is 16 ms. Each row would be addressed approximately every 0.3 ms during the storage operation in the memory maps illustrated in FIGS. 3A and 5B, thereby eliminating the need for separate refresh signals during a storage operation.

The invention has been described with particular reference to certain preferred embodiments thereof, but it will be understood that modifications and variations can be made within the spirit and scope of the claims. For example, while the above-described embodiment employed two data banks, other data bank configurations are possible if the memory devices employed in the data banks have a write cycle time greater than the input pixel data rate, but less than the input pixel data rate multiplied by the number of data banks provided. In other words, if the memory devices had a write cycle time of 200 ns three memory banks would be employed and the incoming data words would be alternately stored in the three memory banks.

Also, while the above-described embodiment included a separate control unit that addressed the data banks of the frame buffer, address and control circuitry can be readily included within the frame buffer structure in other applications. Either a microprocessor or discrete circuitry may be employed for the control unit 20.

Finally, the invention is not limited to the use of DRAMs as the memory devices employed in the data banks 34 and 36 or memory devices having the particular storage capacity and/or operating parameters as those set forth above with respect to the disclosed embodiment. Any type of memory device having a write cycle time greater than the data rate, but less than the input pixel data rate multiplied by the number of data banks provided, may be employed.

What is claimed is:

1. A digital buffer for storing data words of a sequential data stream, said digital buffer comprising: at least two data banks, each data bank including a plurality of memory devices coupled to an input data buss and each memory device having a write cycle time greater than the data rate of the data words of the sequential data stream, that are received from the input data buss and are each representative of a single image pixel, and less than the data rate multiplied by the number of data banks provided in the digital buffer; and a control means coupled to each data bank via control lines and an address buss for controlling the storage of the data words received directly in the memory banks from the input data buss wherein successive data words are stored in alternating data banks.

2. An apparatus for storing digital image data, the digital image data including a plurality of sequential data words, each data word having a predetermined number of data bits and representing a single image pixel, said apparatus comprising:
 a) at least two data banks, each data bank including a plurality of memory devices having a plurality of storage locations, each memory device having a write cycle time greater than a data rate of the sequential data words which are representative of individual image pixels and less than the data rate multiplied by the number of data banks provided in the frame buffer;
 b) an input data buss coupled to each of the memory devices; and
 c) a control means coupled to the data banks for controlling the addressing of the data banks during a storage operation to store successive data words received directly from the input data buss in alternating data banks.

3. An apparatus as claimed in claim 2, wherein each data bank includes a number of memory devices equal to the number of bits in the data word.

4. An apparatus as claimed in claim 2, wherein the memory devices comprise DRAMs.

5. An apparatus as claimed in claim 4, wherein the DRAMs have an X-Y addressing architecture and the X-Y addressing architecture is arranged in the form of a substantially square array having an equal number of columns and rows, and wherein data words are stored sequentially in the columns of the DRAMs under control of the control means.

6. A method of storing sequential image data comprising the steps of:
 a. generating a sequential input data stream including a plurality of successive odd and even data words representative of individual image pixels with an electronic imaging device;
 b. selecting a first data bank to receive an odd data word from the sequential input data stream with a control unit;
 c. storing the odd data word in the first data bank under the control of the control unit;
 d. selecting a second data bank to receive a successive even data word while the odd data word is being stored in the first data bank with the control unit;
 e. storing the successive even data word in the second data bank while the odd data word is being stored in the first data bank under the control of the control unit; and
 f. repeating steps b-e until all of the odd data words in the sequential input data stream have been stored in the first data bank and all of the even data words in the sequential input data stream have been stored in the second data bank.

7. An electronic camera comprising:
 an electronic imaging device that generates a sequential data stream including a plurality of data words each representative of individual image pixels in response to incident light;
 exposure means for exposing the electronic imaging device to incident light;
 a frame buffer including at least two data banks, each data bank including a plurality of memory devices having a plurality of storage locations, wherein the memory devices have write cycle times greater than a data rate of the sequential data stream and less than the data rate of the sequential data stream multiplied by the number of data banks provided in the frame buffer;
 an input data buss coupled directly to each of the memory devices and to the electronic imaging device for transferring data words from the electronic imaging device to the memory devices; and
 a control means coupled to the data bank for controlling the addressing of the data banks during a storage operation to store successive data words received directly from the input data buss in alternating data banks.

* * * * *